United States Patent [19]

Weikel

[11] Patent Number: 4,999,569
[45] Date of Patent: Mar. 12, 1991

[54] METHOD TO CALIBRATE MAGNETO-OPTIC BASED METERING SYSTEM

[75] Inventor: Scott J. Weikel, Raleigh, N.C.

[73] Assignee: ABB Power T&D Company, Blue Bell, Pa.

[21] Appl. No.: 401,708

[22] Filed: Sep. 1, 1989

[51] Int. Cl.⁵ .................... G01R 31/02; G01R 35/02; G01R 35/04
[52] U.S. Cl. .................... 324/74; 324/130; 324/142; 364/571.01
[58] Field of Search ............ 324/79, 130, 142, 571.01, 324/571.04, 571.05

[56] References Cited

U.S. PATENT DOCUMENTS

| | | | |
|---|---|---|---|
| 2,599,378 | 6/1952 | Fleischmann | 324/74 |
| 3,305,768 | 2/1967 | Koep | 324/74 |
| 4,061,891 | 12/1977 | Pommer | 324/142 |
| 4,163,938 | 8/1979 | Moore | 324/74 |
| 4,514,686 | 4/1985 | Mayfield | 324/142 |
| 4,766,370 | 8/1988 | Carr | 324/74 |
| 4,839,819 | 6/1989 | Begin et al. | 324/142 |

Primary Examiner—Kenneth Wieder
Assistant Examiner—William J. Burns
Attorney, Agent, or Firm—A. J. Rossi

[57] ABSTRACT

Apparatus for effecting field calibration of a portion of an electrical energy metering system, the system including a magneto-optic metering transducer (2,30) for producing an optical output signal representative of the current or voltage component of energy to be metered, and the portion of the system which is to be calibrated including a circuit unit (16,50) for receiving, when the metering system is in operation, the output signal produced by the metering transducer and a signal representative of the other component of the energy to be metered, and for generating an output signal representative of the energy delivered by the current and voltage components. The apparatus is composed of: a source (24) for providing calibrating alternating voltage and alternating current signals; a magneto-optic calibration transducer (22,54) for producing an optical output signal representative of one of the calibrating signals and for supplying its output signal to the circuit unit (16,50), in place of the output signal produced by the metering transducer (2,30); a conductor for supplying a signal representative of the other calibrating signal to the circuit unit (16,50), in place of the signal representative of the other component of the energy to be metered; and a metering device (26) connected to receive the calibrating signals provided by the source (24) and the output signal from the circuit unit (16,50) for providing an indication of the relation between the energy delivered by the calibrating signals and the energy represented by the output signal generated by the circuit unit (16,50) during a selected measuring interval.

9 Claims, 2 Drawing Sheets

METHOD TO CALIBRATE MAGNETO-OPTIC BASED METERING SYSTEM

BACKGROUND OF THE INVENTION

The present invention relates to systems for calibrating energy meters employing magneto-optic current transducers (MOCTs).

Recently, metering systems employing such transducers for monitoring electrical energy consumption or transfer have been introduced. While procedures exist for calibrating such systems at the factory, there is a need for the capability of recalibrating these systems after they have been installed in the field.

In addition, since existing energy meters are calibrated with a 120 VAC, 5A source, it would be desirable to be able to recalibrate MOCT metering systems with such a source.

To date, there is no available system for performing this operation.

SUMMARY OF THE INVENTION

It is an object of the present invention to provide a field calibration apparatus for MOCT energy metering systems.

A further object of the invention is to provide field calibration apparatus which can utilize a standard 120 VAC, 5 A source.

Another object of the invention is to provide calibration apparatus which can be easily connected to the metering components to be calibrated and which can be operated in a manner corresponding to that employed for calibrating conventional metering systems.

The above and other objects are achieved, according to the present invention, by apparatus for effecting field calibration of a portion of an electrical energy metering system, the system including a magnetooptic metering transducer connected for receiving an electrical input signal representative of one of the current component and the voltage component of the energy to be metered and for producing an optical output signal representative of the electrical input signal, and the portion of the system which is to be calibrated including circuit means having an optical input for receiving, when the metering system is in operation, the optical output signal produced by the metering transducer, a second input for receiving a signal representative of the other component of the energy to be metered, and an electrical output for generating an output signal representative of the energy delivered by the current and voltage components, the apparatus comprising: source means for providing a calibrating alternating voltage signal and a calibrating alternating current signal, each having a selected magnitude; a magneto-optic calibration transducer connected to receive one of the calibrating signals produced by the source means for producing an optical output signal representative of the one calibrating signal; means for supplying the optical output signal produced by the calibration transducer to the optical input of the circuit means, in place of the optical output signal produced by the metering transducer; means for supplying a signal representative of the other calibrating signal to the second input of the circuit means, in place of the signal representative of the other component of the energy to be metered; and energy measuring means connected to receive the calibrating signals provided by the source means and the output signal generated at the electrical output of the circuit means for providing an energy reading indicative of the relation between the energy delivered by the calibrating signals and the energy represented by the output signal generated at the electrical output of the circuit means during a selected measuring interval.

DESCRIPTION OF THE PREFERRED EMBODIMENTS

Figure 1:
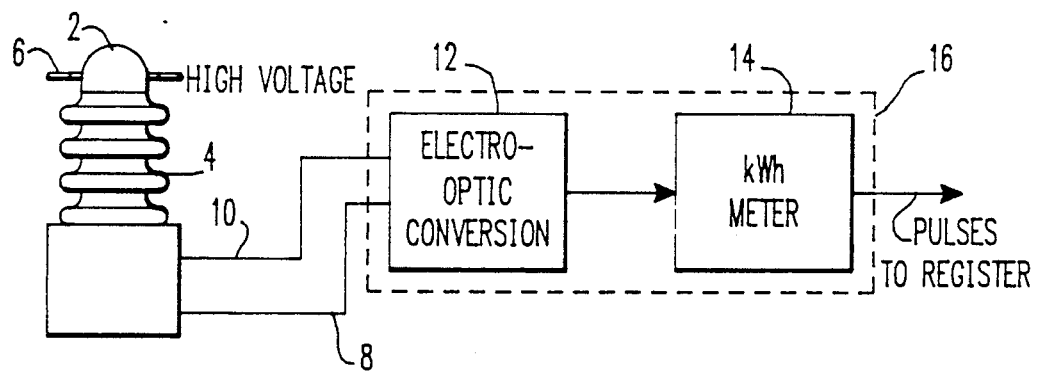
FIG. 1 is a block circuit diagram of a metering system employing a magneto-optic current transducer as the current sensor.

FIG. 1 shows an MOCT current measuring circuit employed in a high voltage environment, for example in a utility power distribution station operating at a voltage level of the order of 100 KV and a current level of the order of 1000A. The circuit includes an MOCT 2 mounted on a suitable high voltage insulating standoff 4 for monitoring the current through a power conductor 6.

MOCT 2 forms a part of an optical path which includes input and output fibers 8 and 10 connected to an electro-optical conversion device 12. Optical radiation is conducted through fiber 8 to MOCT 2 and then through fiber 10. The intensity relation between the AC component of the optical energy in fiber 8 and that in fiber 10 is proportional to the instantaneous magnitude of the current in conductor 6.

Device 12 provides an output signal representative of the current through conductor 6. This signal may be applied to an energy meter 14, together with a signal representative of line voltage, to produce a signal representative of the electrical energy being transferred.

Figure 2:
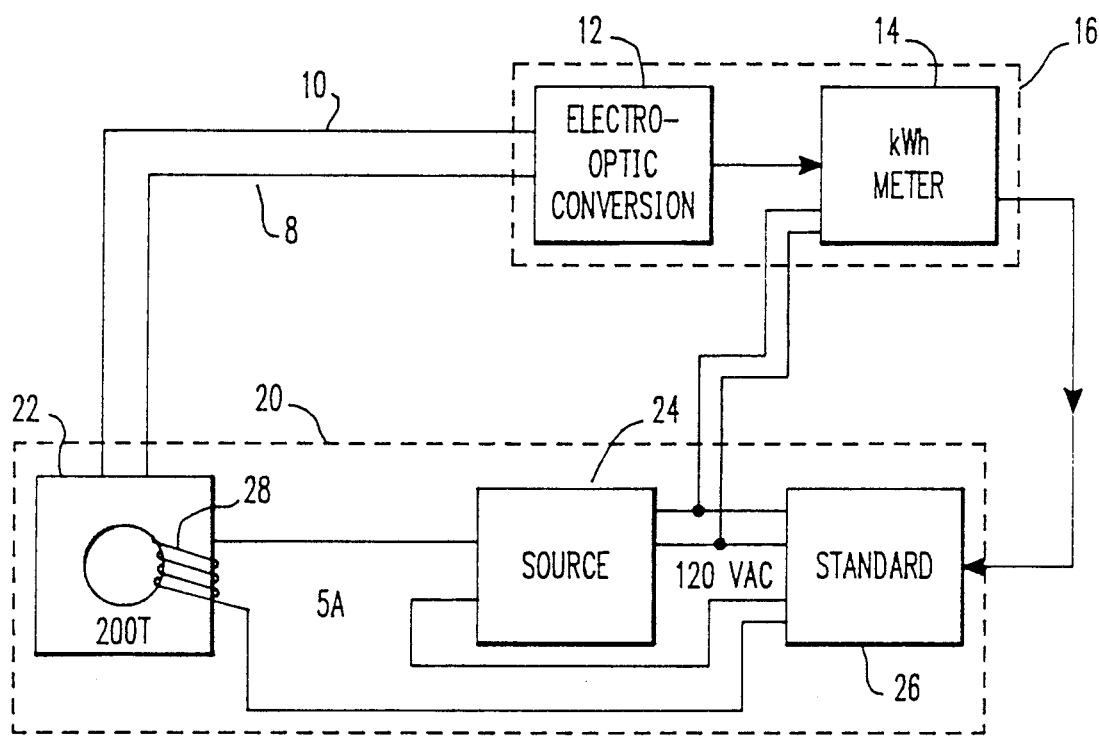
FIG. 2 is a block circuit diagram of a calibration apparatus according to the present invention connected to the components of the arrangement of FIG. 1 which are to be calibrated.
Figure 3:
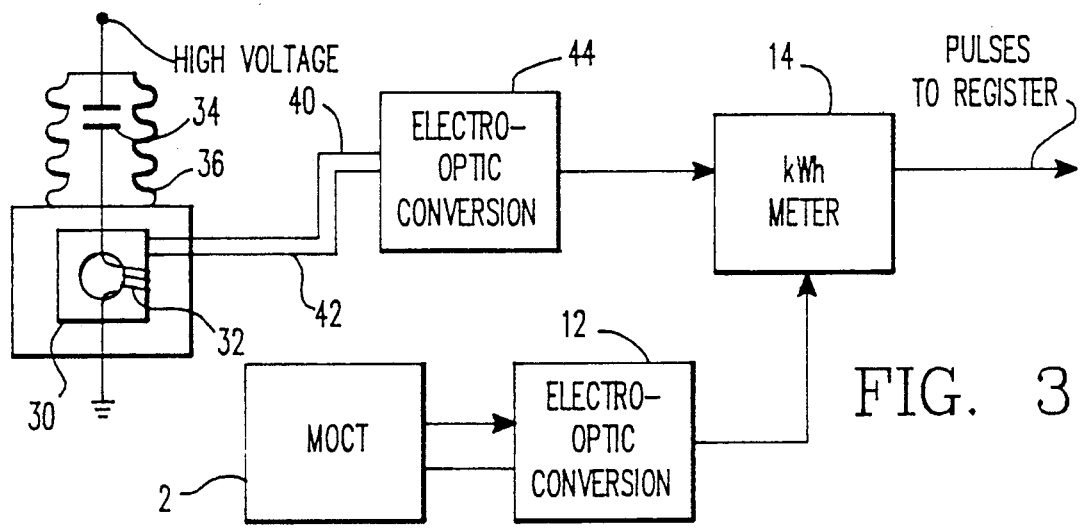
FIG. 3 is a block circuit diagram of a metering system employing as both current and voltage sensors.
Figure 4:
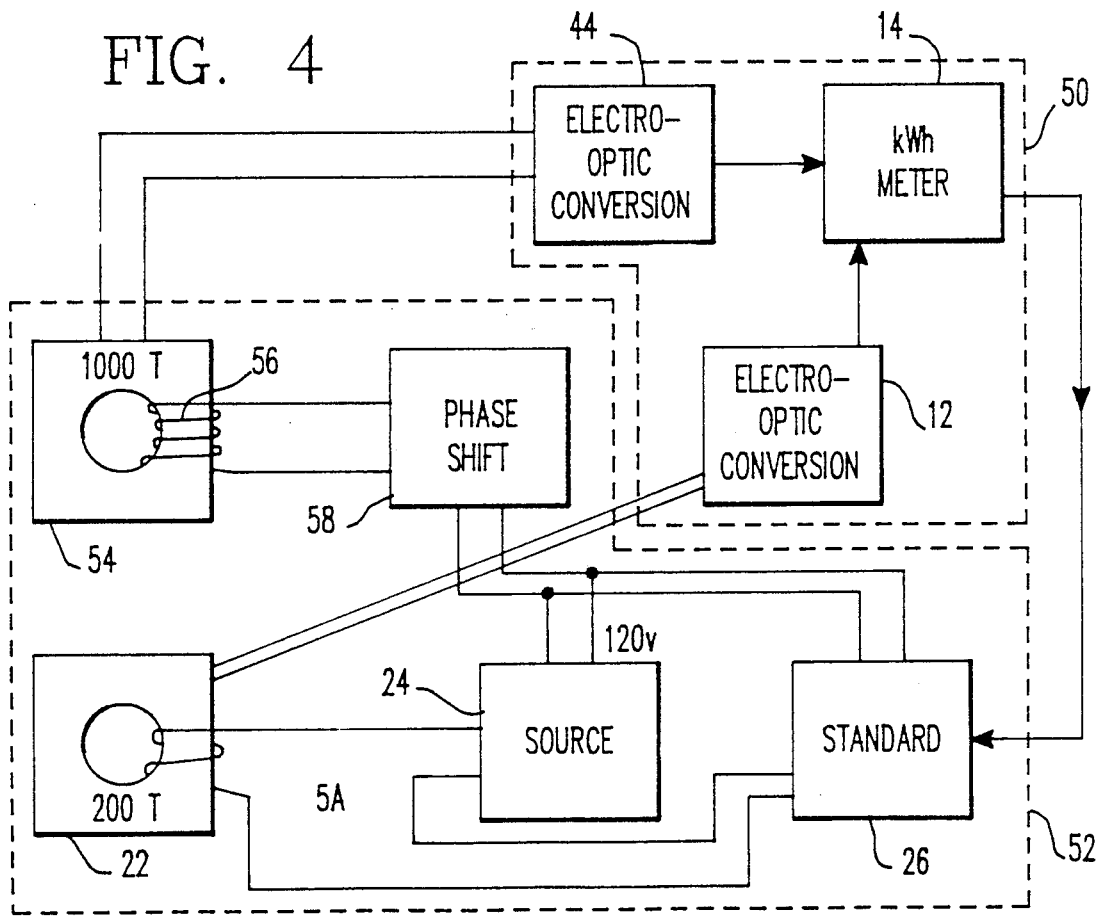
FIG. 4 is a block circuit diagram of an embodiment of calibration apparatus according to the invention for calibrating components of the apparatus of FIG. 3.

FIG. 1, as well as FIGS. 2-4, illustrates a single power phase. As is well known in the art, a complete metering system for plural phase power would include a plurality of devices 2 and 12, each measuring a respective phase current. The output of each device 12 would be supplied to meter 14, along with a plurality of signals each representative of a respective phase voltage, and these signals will be combined in meter 14 to produce a signal representative of the plural phase energy being transferred.

Meter 14 may be of the type which produces a pulse train output in which each pulse represents a predetermined quantity of energy, from which it follows that a count of these pulses provides an indication of the total energy transferred during a selected measuring interval.

Device 12 and meter 14 constitute a monitoring unit 16 which may require occasional recalibration after having been installed in the field, preferably with the aid of a conventional calibration current source and an energy standard.

According to the present invention, as shown in FIG. 2, recalibration is performed with a calibration device 20 containing an MOCT 22, a conventional calibration current and voltage source 24 providing a current of 5A and a voltage of 120 V, and an energy standard 26 constructed to produce an accurate indication of the energy transfer represented by current and voltage values supplied thereto. Alternatively, the calibration voltage and current could be supplied by two individual sources. Standard 26 may be a device marketed under the trade name RADIAN.

In the case of a metering system of the type described above, the current produced by conventional source 24 is substantially lower than the desired test current for meter 14. In order to supply unit 16 with an optical input corresponding to the desired test current, MOCT 22 is provided with a multi-turn conductor 28 which produces an optical response equal to that produced by the current supplied by source 24 multiplied by the number of turns of conductor 28.

The current produced by source 24 and flowing through conductor 28 also serves as the current input to standard 26.

The optical response of MOCT 22 is processed by device 12 whose output is applied to meter 14. A voltage signal is supplied by source 24 to both meter 14 and standard 26 and the output signal from meter 14 is applied to standard 26 to permit comparison with the reading produced in standard 26 to provide an indication of the accuracy of unit 16.

If meter 14 produces a pulse train as described above, this train can be subject to a frequency division. Each frequency divided pulse can then be applied as a gating pulse to standard 26 so that each gating pulse defines one measuring interval that will correspond to the measurement of a given quantity of energy in standard 26 if unit 16 is correctly calibrated.

By effecting a frequency division which gives each gating pulse a substantial duration, the resolution, or precision, and accuracy of the measuring result can be improved. When the energy being metered and the calibrating signals have a frequency of 60 Hz, this result can be achieved by giving each gating pulse a duration of the order of 10 to 20 sec.

If the measurement result reveals that unit 16 is not properly calibrated, proper calibration can be achieved by adjusting setting elements forming part of device 12.

Generally, each MOCT installed in the field has slightly different response characteristics which are taken into account by an individually determined correction factor. When a given MOCT is connected to a unit 16, which is initially done as part of the manufacturing operation, the response of the unit is manually adjusted in accordance with this correction factor. During a recalibration procedure conducted with the device shown in FIG. 2, the difference between MOCTs 2 and 22 with regard to correction factor is taken into account to determine the desired reading to be produced by standard 26.

If unit 16 is equipped to effect temperature compensation of its output signal based on an externally generated temperature signal, calibration device 20 may be further provided with a source of a signal representing a standard temperature value connectable to the temperature signal input of unit 16.

It is additionally known to employ an MOCT as a voltage sensor. For this purpose, a basic MOCT is modified by the provision of a multi-turn conductor which extends through the transducer window a plurality of times, and by connecting the conductor in series with a capacitor and then connecting the resulting series arrangement across the voltage to be monitored. The current through the series arrangement will be proportional to the voltage being monitored, the current being phase shifted by approximately 90°, so that the optical output of the MOCT is proportional to the voltage. Typically, the conductor associated with the MOCT may have of the order of 1,000 turns. The resulting device is known as a magneto-optic voltage transducer, or MOVT.

FIG. 3 illustrates an energy metering system including an MOVT of this type in combination with the components 2, 12 and 14 shown in FIG. The MOVT includes a basic MOCT 30 provided with a multi-turn conductor 32 connected in series with a high voltage capacitor 34, the series arrangement of conductor 32 and capacitor 34 being connected between a high voltage line and ground, with a suitable high voltage insulating standoff 36 being interposed between the high voltage line and MOCT 30. The resulting MOVT is provided with input and output optical fibers 40 and 42 connected to a second electro-optical conversion device 44. MOCT 2 is arranged to monitor the current through the high voltage line, in the manner described in connection with FIG. 1.

Device 12 produces an output current signal, while device 44 produces an output voltage signal, both of which are applied to kWh meter 14 which produces energy pulses that are supplied to a register (not shown).

Referring to FIG. 4, the unit 50 composed of devices 12 and 44 and meter 14 may be calibrated by means of a calibration device 52 composed of source 24, standard 26, a MOCT 54 connected to serve as a calibration MOVT, and MOCT 22. MOCT 54 is provided with a multi-turn conductor 56 which may have the same number of turns as conductor 32.

In this embodiment, between the voltage supplied by source 24 and conductor 56 there is provided a phase shifter 58 which duplicates the function of capacitor 34. Phase shifter 58 may be constituted by a capacitor connected to form a series arrangement with conductor 56, or may be a suitably dimensioned electronic phase shifter.

If phase shifter 58 is a simple capacitor, and if the voltage monitored by MOCT 30 in the system of FIG. 3 is different from 120 V, then the capacitor of phase shifter 58 will be given a value n times greater than that of capacitor 34, where n equals the ratio between the high voltage monitored by the arrangement shown in FIG. 3 and 120 V. Then, if the number of turns of conductor 56 is equal to that of conductor 32, the current through MOCT 54 will be the same as that through MOCT 30.

The calibration operation would then be carried out in the same manner as described above with respect to FIG. 2, with any necessary adjustments being made to either one or both of devices 12 and 44.

In both calibration units described above, standard 26 produces an output in energy, i.e., kWh, units. For a given calibration operation, the operator would be provided with information as to the reading which standard 26 should produce, for each gating pulse applied thereto, when the unit 16 or 50 is correctly calibrated.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. Apparatus for effecting field calibration of a portion of an electrical energy metering system, the system including a magneto-optic metering transducer connected for receiving an electrical input signal representative of one of the current component and the voltage component of the energy to be metered and for producing an optical output signal representative of the electrical input signal, and the portion of the system which is to be calibrated including circuit means having an optical input for receiving, when the metering system is in operation, the optical output signal produced by the metering transducer, a second input for receiving a signal representative of the other component of the energy to be metered, and an electrical output for generating an output signal representative of the energy delivered by the current and voltage components, said apparatus comprising: source means for providing a calibrating alternating voltage signal and a calibrating alternating current signal, each having a selected magnitude; a magneto-optic calibration transducer connected to receive one of the calibrating signals produced by said source means for producing an optical output signal representative of the one calibrating signal; means for supplying the optical output signal produced by said calibration transducer to the optical input of the circuit means, in place of the optical output signal produced by the metering transducer; means for supplying a signal representative of the other calibrating signal to th second input of the circuit means, in place of the signal representative of the other component of the energy to be metered; and energy measuring means connected to receive the calibrating signals provided by said source means and the output signal generated at the electrical output of the circuit means for providing an energy reading indicative of the relation between the energy delivered by the calibrating signals and the energy represented by the output signal generated at the electrical output of the circuit means during a selected measuring interval.

2. Apparatus as defined in claim 1 wherein the electrical signal received by the metering transducer is representative of the current component of the energy to be metered and that current component has a nominal magnitude which is substantially greater than the magnitude of the calibrating alternating current signal, and said calibration transducer comprises an optical signal controlling member having an opening and constituting means for causing the optical output signal to have a value proportional to the magnitude of the magnetic field produced by a current flowing through the opening, and current supply means connected between said source means and said controlling member for supplying the calibrating alternating current signal to said member in a manner to cause the optical output signal produced by said calibration transducer to be representative of a current magnitude corresponding substantially to the nominal magnitude of the current component of the energy to be metered.

3. Apparatus as defined in claim 2 wherein said current supply means comprise a conductor formed to have a plurality of turns which pass through said opening of said controlling member so that the optical signal produced by said calibration transducer is proportional to the product of the current flowing through said conductor and the number of turns of said conductor which pass through said opening.

4. Apparatus as defined in claim 3 wherein the second input of the circuit means is an optical input and said means for supplying a signal representative of the other calibrating signal comprise a magneto-optic calibrating voltage transducer for supplying an optical output signal to said second input, in place of the signal representative of the other component of the energy to be metered.

5. Apparatus as defined in claim 4 wherein said calibrating voltage transducer comprises an electrical input connected to receive the calibrating voltage signal produced by said source means.

6. Apparatus as defined in claim 1 wherein the electrical signal received by the metering transducer is a current having a magnitude which is a fixed proportion of the magnitude of the voltage component of the energy to be metered, and said calibration transducer comprises an optical signal controlling member having an opening and constituting means for causing the optical output signal to have a value proportional to the magnitude of the magnetic field produced by the current flowing through the opening, and current supply means connected between said source means and said controlling member for supplying to said member a current derived from the calibrating alternating voltage signal in a manner to cause the optical output signal produced by said calibration transducer to be representative of a voltage magnitude corresponding substantially to the nominal magnitude of the voltage component of the energy to be metered.

7. Apparatus as defined in claim 6 wherein: the voltage component of the energy to be metered has a nominal magnitude which is substantially greater than the magnitude of the calibrating alternating voltage signal; the metering transducer comprises an optical signal controlling member having an opening and constituting means for causing the optical output signal to have a value proportional to the magnitude of the magnetic field produced by the current received by the metering transducer, and current supply means connected to the controlling member of the metering transducer for supplying thereto the current having a magnitude which is a fixed proportion of the magnitude of the voltage component of the energy to be metered; and said current supply means of said calibration transducer are operative for causing the magnitude of the magnetic field produced in said calibration transducer by the current derived from the calibrating alternating voltage to be substantially equal to the magnitude of the magnetic field produced in the metering transducer by the current having a magnitude which is a fixed proportion of the magnitude of the voltage component of the energy to be metered.

8. Apparatus as defined in claim 7 wherein: the current supply means of the metering transducer includes a series arrangement of a conductor extending through the opening of the optical signal controlling member of the metering transducer and a capacitor, the series arrangement being connected to receive the voltage component of the energy to be metered; said current supply means of said calibration transducer comprise a series arrangement of a conductor extending through said opening of said optical signal controlling member of said calibration transducer and a capacitor, said series arrangement being connected to receive the calibrating alternating voltage signal; and the ratio of the capacitance of said capacitor of said calibration transducer to the capacitance of the capacitor of the metering transducer is substantially equal to the ratio of the nominal magnitude of the voltage component of the energy to be metered to the magnitude of the calibrating alternating voltage signal.

9. Apparatus as defined in claim 1 wherein the output signal generated at the output of the circuit means of the energy metering system is in the form of a pulse having a duration representing a predetermined quantity of energy, and said energy measuring means are operative for providing an indication of the energy delivered by the calibrating signals during the period of the pulse.

* * * * *